United States Patent
Xu et al.

(10) Patent No.: US 9,859,310 B2
(45) Date of Patent: Jan. 2, 2018

(54) DISPLAY PANEL AND DISPLAY DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Xin Xu, Shanghai (CN); Huijun Jin, Shanghai (CN); Feng Qin, Shanghai (CN); Zhiqiang Xia, Shanghai (CN); Dongliang Dun, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/335,389

(22) Filed: Oct. 26, 2016

(65) Prior Publication Data

US 2017/0047361 A1    Feb. 16, 2017

(30) Foreign Application Priority Data

Jun. 30, 2016  (CN) .......................... 2016 1 0511242

(51) Int. Cl.
*H01L 27/13*     (2006.01)
*H01L 29/786*   (2006.01)
(Continued)

(52) U.S. Cl.
CPC .......... *H01L 27/13* (2013.01); *H01L 23/5227* (2013.01); *H01L 23/53214* (2013.01);
(Continued)

(58) Field of Classification Search
CPC ............... H01L 27/13; H01L 29/78633; H01L 29/78672; H01L 27/124; H01L 28/10; H01L 23/53214; H01L 23/53257; H01L 23/5227; H01L 29/78678; H01L 29/78675; G06F 3/041; G06F 3/046
See application file for complete search history.

(56) References Cited

U.S. PATENT DOCUMENTS

| 7,679,585 | B2 * | 3/2010 | Kimura ................ G09G 3/3241 345/76 |
| 2015/0228799 | A1 * | 8/2015 | Koezuka ............... H01L 27/124 257/43 |
| 2015/0355758 | A1 * | 12/2015 | Zhang ..................... G06F 3/046 345/174 |

FOREIGN PATENT DOCUMENTS

CN           102479995 A      5/2012

* cited by examiner

*Primary Examiner* — Roy Potter
*Assistant Examiner* — Paul Patton
(74) *Attorney, Agent, or Firm* — Kilpatrick Townsend & Stockton LLP (57) ABSTRACT

A display panel and a display device including the display panel are provided. The display panel includes data lines and scan lines arranged to be intersected, and a sensing antenna. The data lines and the scan lines are located in a display region of the display panel, and define multiple sub-pixels. The sensing antenna includes multiple sensing coils and is at least partly located in the display region of the display panel, and projections of the data lines and/or the scan lines cover projections of the sensing coils in a direction perpendicular to a surface of the display panel, in order to avoid affection on an aperture ratio of the display panel caused by the sensing coils located in the display region.

19 Claims, 12 Drawing Sheets

(51) Int. Cl.
*H01L 27/12* (2006.01)
*H01L 23/522* (2006.01)
*H01L 49/02* (2006.01)
*H01L 23/532* (2006.01)

(52) U.S. Cl.
CPC ...... *H01L 23/53257* (2013.01); *H01L 27/124* (2013.01); *H01L 28/10* (2013.01); *H01L 29/78633* (2013.01); *H01L 29/78672* (2013.01); *H01L 29/78675* (2013.01); *H01L 29/78678* (2013.01)

DISPLAY PANEL AND DISPLAY DEVICE

CROSS REFERENCE OF RELATED APPLICATION

The present application claims the priority to Chinese Patent Application No. 201610511242.6, titled "DISPLAY PANEL AND DISPLAY DEVICE", filed on Jun. 30, 2016 with the State Intellectual Property Office of the PRC, which is incorporated herein by reference in its entirety.

FIELD

The present disclosure relates to the technical field of display, and in particular to a display panel and a display device.

BACKGROUND

With the development of technology, techniques of wireless charging and near field communication (NFC) are applied in display panels more and more. The technique of wireless charging refers to winding a wire as a coil and causing a power sending side and a power receiving side to induce with each other in accordance with the electromagnetic induction principle so as to charge. The technique of near field communication refers to causing a signal sending end and a signal receiving end to induce with each other in accordance with the electromagnetic induction principle, which is widely applied in card payment and data transmission.

It follows that, both of the technique of wireless charging and the technique of near field communication are realized in accordance with the electromagnetic induction principle by winding a wire as a coil to act as a sensing antenna. However, a sensing antenna in an existing display panel is normally located in a border region of the display panel. Although the volume of the display panel is reduced, the number of windings of a coil is small due to the limitation of the area of the border region, resulting in low conversion efficiency of the sensing antenna.

SUMMARY

In order to solve the above technical problem, a display panel is provided according to embodiments in the present disclosure for improving the conversion efficiency of the sensing antenna.

In order to address the above issue, technical solutions are provided according to embodiments in the present disclosure as follows.

A display panel includes data lines and scan lines arranged to be intersected, and a sensing antenna. The data lines and the scan lines arranged to be intersected are located in a display region of the display panel, and define multiple sub-pixels. The sensing antenna includes multiple sensing coils and is at least partly located in the display region of the display panel. Projections of the data lines and/or the scan lines cover projections of the sensing coils in a direction perpendicular to a surface of the display panel.

A display device includes the above display panel.

The above technical solutions have advantages as follows over the conventional technology.

The display panel provided according to the embodiments in the present disclosure includes the data lines and the scan lines arranged to be intersected, and the sensing antenna. The data lines and the scan lines arranged to be intersected are located in the display region of the display panel, and define the multiple sub-pixels. The sensing antenna includes the multiple sensing coils and is at least partly located in the display region of the display panel, in order to enlarge the area occupied by the sensing antenna and increase the number of the sensing coils that can be accommodated in the display panel, thereby improving the conversion efficiency of the sensing antenna. Also, in the display panel provided according to the embodiments in the present disclosure, the projections of the data lines and/or the scan lines cover the projections of the sensing coils in the direction perpendicular to the surface of the display panel, in order to avoid affection on an aperture ratio of the display panel caused by the sensing coils located in the display region.

BRIEF DESCRIPTION OF THE DRAWINGS

The accompanying drawings needed to be used in the description of the embodiments or the conventional technology are described briefly as follows, so that the technical solutions according to the embodiments in the present disclosure or according to the conventional technology become clearer. It is apparent that the accompanying drawings in the following description show only some embodiments in the present disclosure. For those skilled in the art, other accompanying drawings may be obtained according to these accompanying drawings without any creative work.

DETAILED DESCRIPTION OF EMBODIMENTS

The technical solution is described clearly and completely as follows with reference to the accompanying drawings for the embodiments in the present disclosure. It is apparent that the described embodiments are only a part of the embodiments. All the other embodiments obtained by those skilled in the art based on the embodiments in the present disclosure without any creative work fall into the protection scope of the present disclosure.

More specific details are set forth in the following descriptions for sufficient understanding of the disclosure, but the disclosure can also be implemented by other ways different from the way described herein. Similar extensions can be made by those skilled in the art without departing from the spirit of the disclosure, and therefore the disclosure is not limited to particular embodiments disclosed herein.

Figure 1:
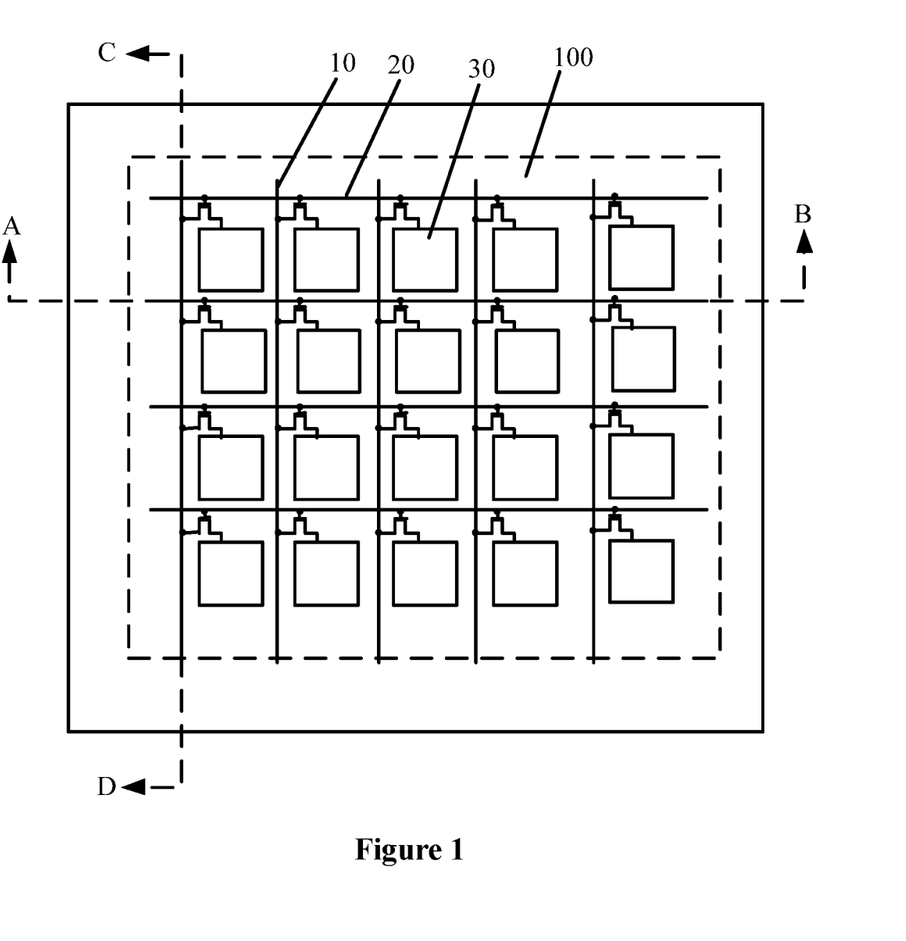
FIG. 1 is a top view of arrangement of scan lines and data lines in a display panel according to the present disclosure.
Figure 2:
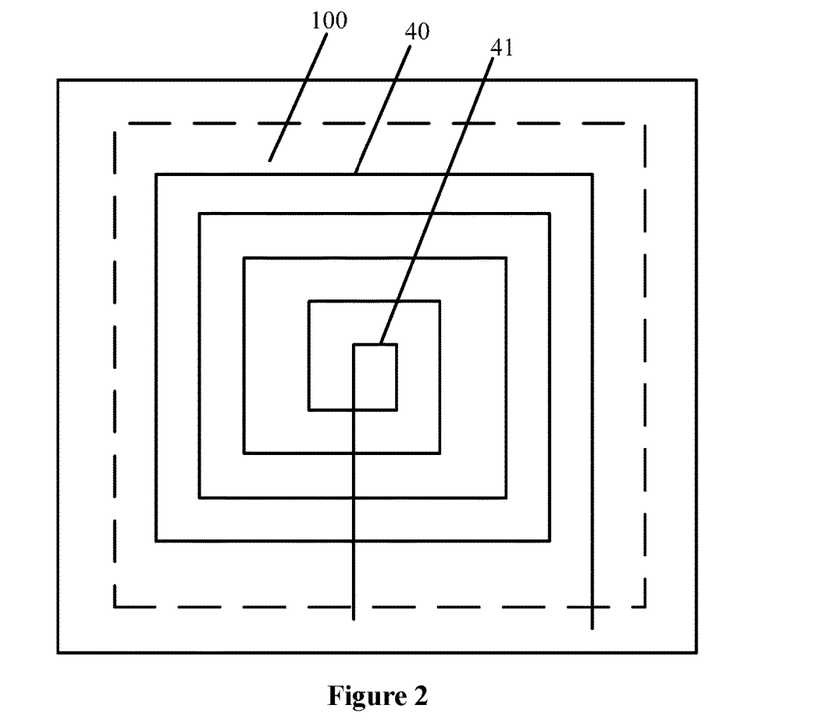
FIG. 2 is a top view of a sensing antenna in a display panel according to the present disclosure.
Figure 3:
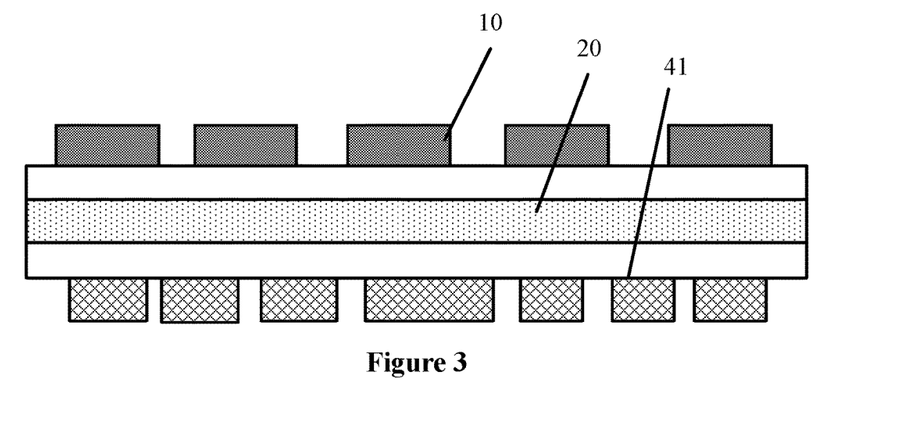
FIG. 3 is a cross-sectional view of the arrangement shown in FIG. 1 along a direction of AB in FIG. 1.
Figure 4:
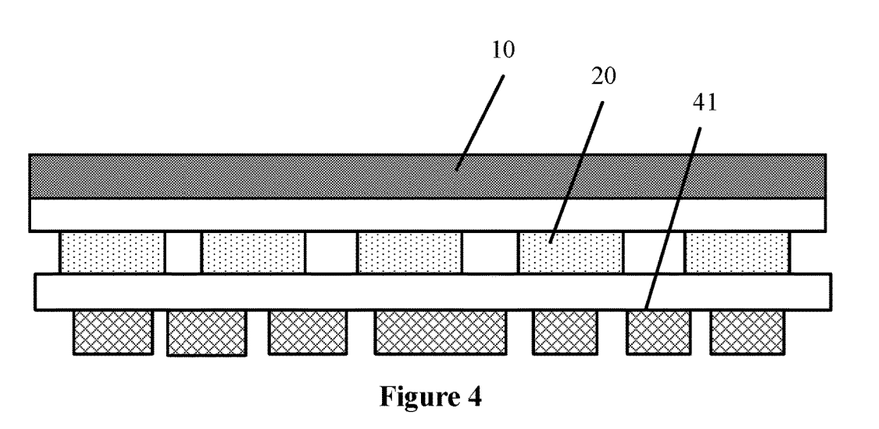
FIG. 4 is a cross-sectional view of the arrangement shown in FIG. 1 along a direction of CD in FIG. 1.

A display panel is provided according to the present disclosure, as illustrated in FIG. 1 to FIG. 4. FIG. 1 is a top view of arrangement of scan lines and data lines in a display panel according to the present disclosure. FIG. 2 is a top view of a sensing antenna in a display panel according to the present disclosure. FIG. 3 is a cross-sectional view of the arrangement shown in FIG. 1 along a direction of AB in FIG. 1. FIG. 4 is a cross-sectional view of the arrangement shown in FIG. 1 along a direction of CD in FIG. 1.

The display panel includes data lines 10 and scan lines 20 arranged to be intersected. As shown in FIG. 1, the data lines 10 and the scan lines 20 arranged to be intersected are located in a display region 100 of the display panel, and define multiple sub-pixels 30.

The display panel further includes a sensing antenna 40. As shown in FIG. 2, the sensing antenna 40 includes multiple sensing coils 41, and the sensing antenna 40 is at least partly located in the display region 100 of the display panel. As shown in FIG. 3 and FIG. 4, projections of the data lines 10 and/or the scan lines 20 cover projections of the sensing coils 41 in a direction perpendicular to a surface of the display panel.

It should be noted that, in this embodiment, the way that the sensing antenna 40 is at least partly located in the display region 100 of the display panel may include a way that the sensing antenna 40 is completely located in the display region 100 of the display panel (as shown in FIG. 2), and may also include a way that the sensing antenna 40 is partly located in the display region 100 of the display panel, which is not limited in the present disclosure and can be determined with practical requirements.

Figure 5:
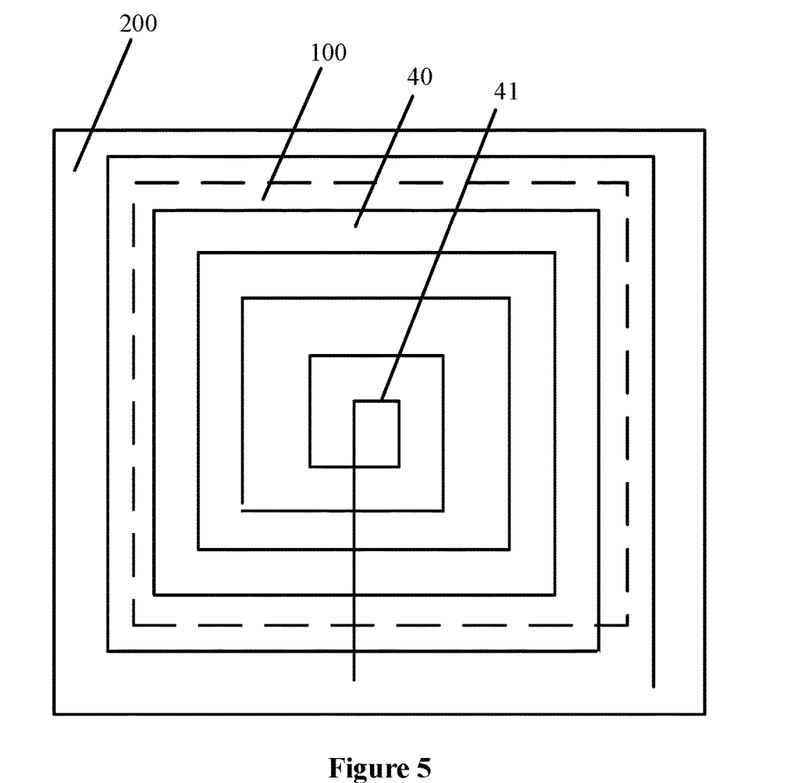
FIG. 5 is a top view of a sensing antenna in a display panel according to the present disclosure.
Figure 6:
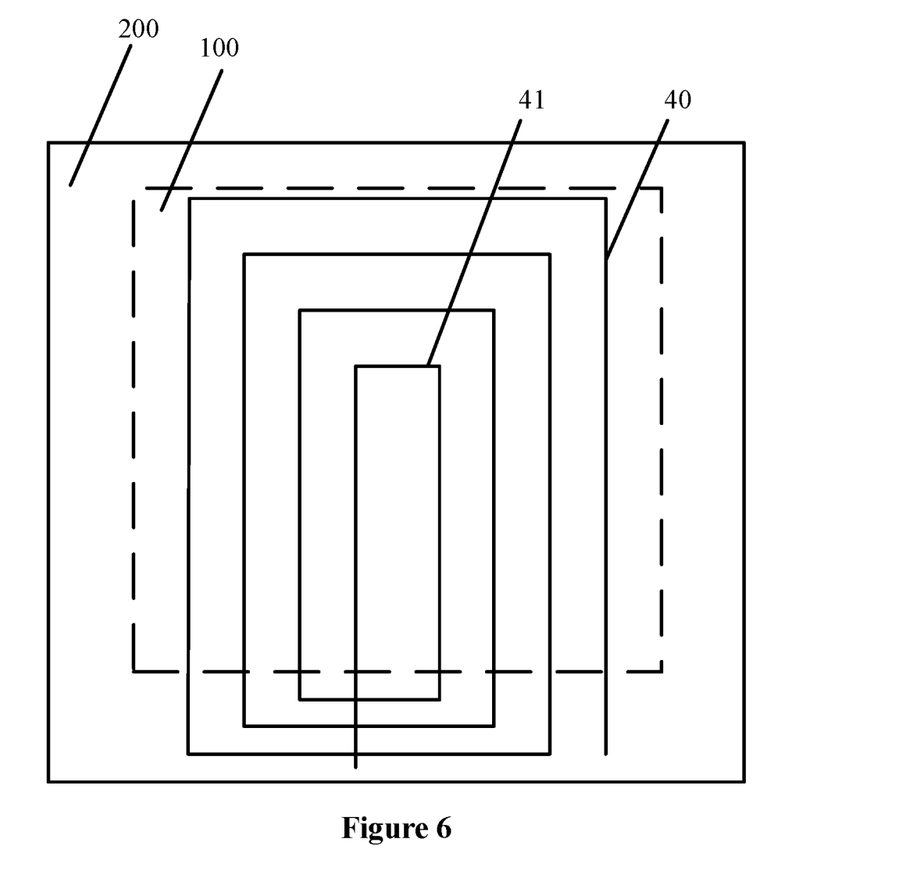
FIG. 6 is a top view of a sensing antenna in a display panel according to the present disclosure.

It should also be noted that, in this embodiment, the way that the sensing antenna 40 is partly located in the display region 100 of the display panel may include a way that one part of the sensing coils 41 in the sensing antenna 40 are located in the display region 100 of the display panel and the other part of the sensing coils 41 are located in a border region 200 of the display panel, as shown in FIG. 5 which is a top view of a sensing antenna in a display panel according to the present disclosure, and may also include a way that one part of each of the sensing coils 41 in the sensing antenna 40 is located in the display region 100 of the display panel and the other part of each of the sensing coils 41 is located in the border region 200 of the display panel, as shown in FIG. 6 which is a top view of a sensing antenna in a display panel according to the present disclosure, which is not limited in the present disclosure and can be determined with practical requirements.

In any one of the above embodiments, the definition that the projections of the data lines 10 and/or the scan lines 20 cover the projections of the sensing coils 41 in the direction perpendicular to the surface of the display panel refers to that the projections of the data lines 10 and/or the scan lines 20 cover the projections of the sensing coils 41 on the display region 100 of the display panel in the direction perpendicular to the surface of the display panel. Specifically, the way that the projections of the data lines 10 and/or the scan lines 20 cover the projections of the sensing coils 41 on the display region 100 of the display panel in the direction perpendicular to the surface of the display panel may include a way that the projections of the data lines 10 and/or the scan lines 20 superpose exactly the projections of the sensing coils 41 on the display region 100 of the display panel in a direction perpendicular to the surface of the display panel, and may also include a way that the projections of the data lines 10 and/or the scan lines 20 are larger than the projections of the sensing coils 41 on the display region 100 of the display panel in the direction perpendicular to the surface of the display panel, which is not limited in the present disclosure, as long as that the projections of the sensing coils 41 are within the projections of the data lines 10 and/or the scan lines 20 on the display region 100 of the display panel in the direction perpendicular to the surface of the display panel.

Figure 7:
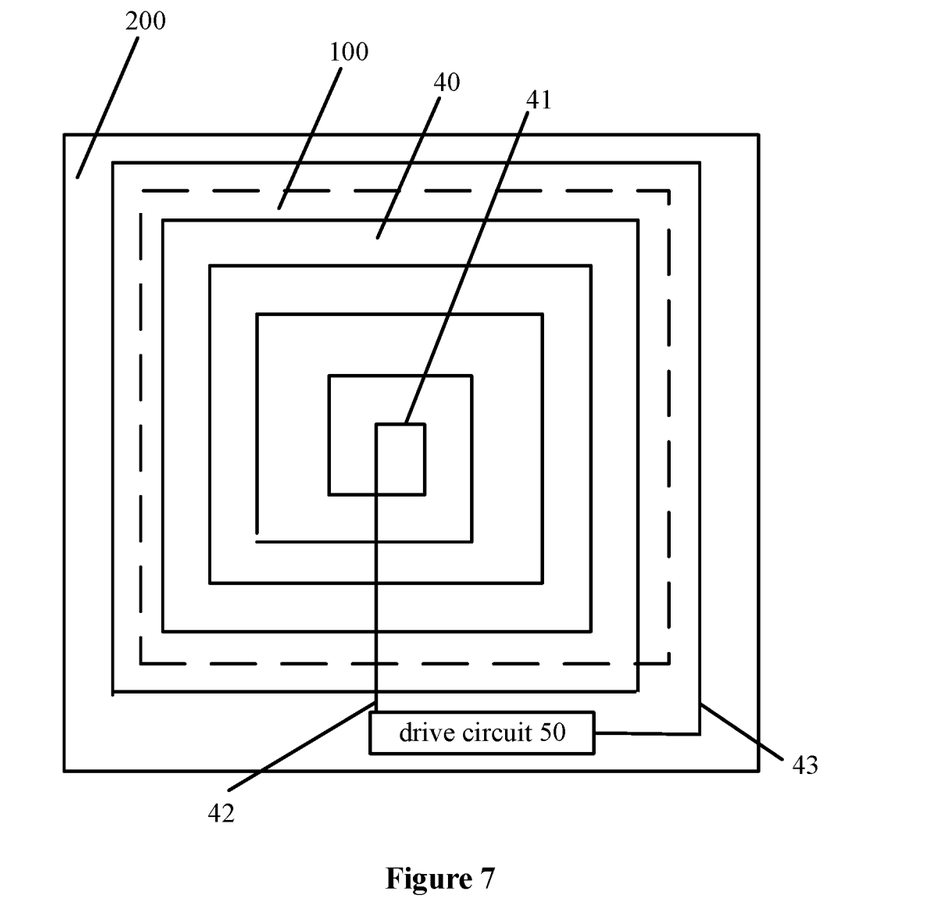
FIG. 7 is a schematic diagram of electrical connection between a sensing antenna and a drive circuit in a display panel according to the present disclosure.
Figure 8:
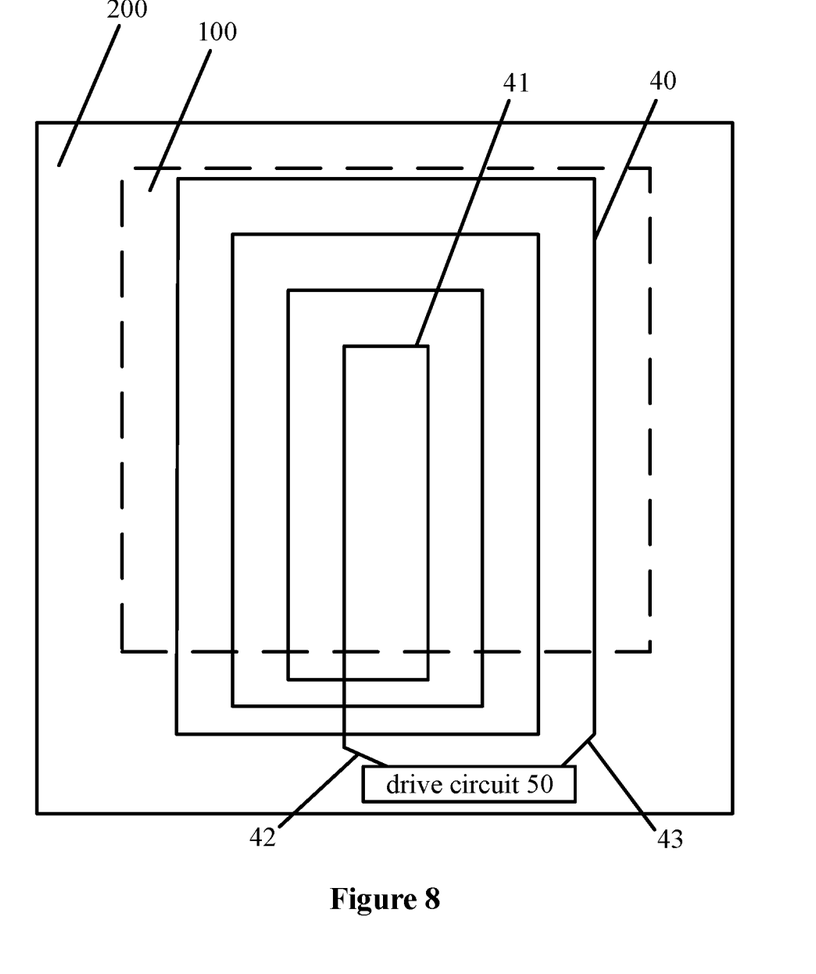
FIG. 8 is a schematic diagram of electrical connection between a sensing antenna and a drive circuit in a display panel according to the present disclosure.

On the basis of any one of the above embodiments, in embodiments as shown in FIG. 7 and FIG. 8 each of which is a schematic diagram of electrical connection between a sensing antenna and a drive circuit in a display panel according to the present disclosure, the sensing antenna 40 includes a first lead 42 at one end of the sensing antenna and a second lead 43 at the other end of the sensing antenna. The first lead 42 is in a different layer from the sensing coils 41 and is overlapped with each of the sensing coils 41 in the sensing antenna 40. The second lead 43 is in a same layer as the sensing coils 41 and is not overlapped with any of the sensing coils 41 in the sensing antenna 40.

It should be noted that, in the embodiment as shown in FIG. 7 and FIG. 8, the first lead 42 and the second lead 43 are electrically connected to a drive circuit 50. The drive circuit 50 is configured to provide a driving signal to the sensing antenna 40 and detect a current signal in the sensing antenna 40 through the first lead 42 and the second lead 43.

It should be noted that, in an embodiment on the basis of any one of the above embodiments, in a case that one part of the sensing antenna 40 is located in the display region 100 of the display panel and the other part of the sensing antenna 40 is located in the border region 200 of the display panel, a part of the leads at either end of the sensing antenna 40 overlapped with the sensing coils 41 is located in the border region 200 of the display panel, as shown in FIG. 8. In this embodiment, the part of the first lead 42 overlapped with the sensing coils 41 is located in the border region 200 of the display panel, the technical solution is not limited thereto. In another embodiment, the part of the leads at either end of the sensing antenna 40 overlapped with the sensing coils 41 may be completely located in the display region 100 of the display panel, or partly located in the display region 100 of the display panel and partly located in the border region 200 of the display panel as shown in FIG. 7, which is determined with practical requirements.

Optionally, in this embodiment, in the case that the first lead 42 is in a different layer from the sensing coils 41, the first lead 42 is electrically connected to the sensing coils 41 through a via hole.

Figure 9:
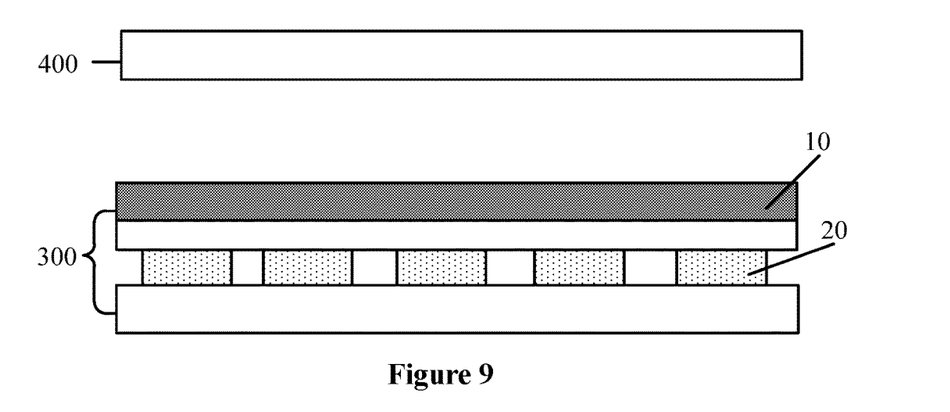
FIG. 9 is a cross-sectional view of an array substrate and a color film substrate in a display panel according to the present disclosure.

In one embodiment, as shown in FIG. 9 which is a cross-sectional view of an array substrate and a color film substrate in a display panel according to the embodiment, the display panel includes an array substrate 300 and a color film substrate 400 arranged opposite to each other. The data lines 10 and the scan lines 20 are located in the array substrate 300, and the sensing antenna 40 is integrated in the array substrate 300 or the color film substrate 400.

Figure 10:
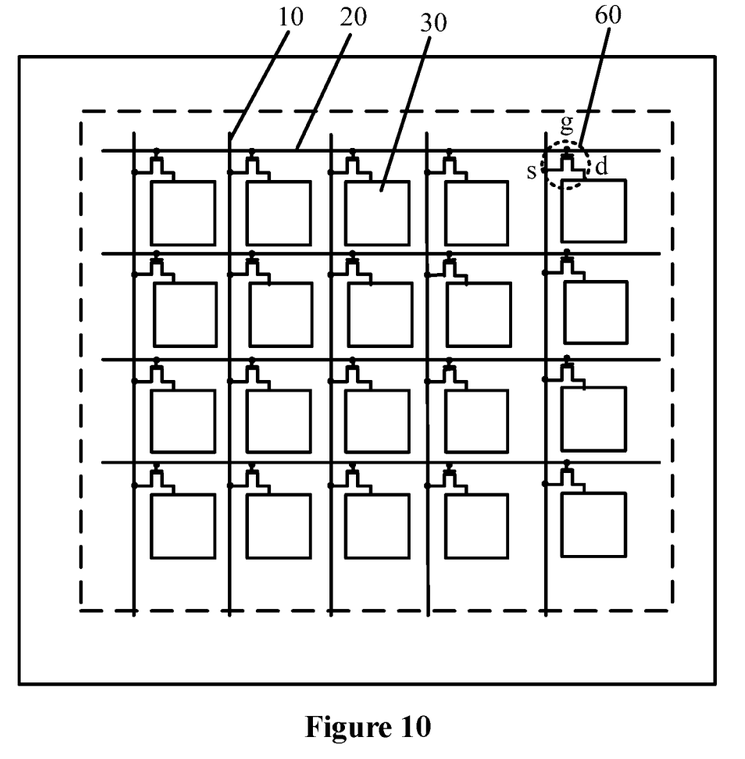
FIG. 10 is a schematic diagram of electrical connection between scan lines, data lines and sub-pixels in a display panel according to the present disclosure.

In one embodiment, as shown in FIG. 10 which is a schematic diagram of electrical connection between scan lines, data lines and sub-pixels in a display panel according to the embodiment, the array substrate 300 further includes film transistors 60 electrically connected to the data lines 10 and the scan lines 20.

Gate electrodes g of the film transistors 60 are electrically connected to the scan lines 20, and source electrodes s or drain electrodes d of the film transistors 60 are electrically connected to the data lines 10, and the film transistors 60 are configured to control display of the sub-pixels 30. In a case that the source electrodes s of the film transistors 60 are electrically connected to the data lines 10, the drain electrodes d of the film transistors 60 are electrically connected to pixel electrodes of corresponding sub-pixels 30. In a case that the drain electrodes d of the film transistors 60 are electrically connected to the data lines 10, the source electrodes s of the film transistors 60 are electrically connected to pixel electrodes of the corresponding sub-pixels 30. It should be noted that, the source electrodes s and the drain electrodes d of the film transistors 60 only represent input terminals and output terminals of the film transistors 60 without a strict correspondence. It is only required that when the film transistors 60 are switched on, signals in the data lines 10 can be inputted through the input terminals of the film transistors 60 and outputted through the output terminals of the film transistors 60. Preferably, the source electrodes s and the drain electrodes d of the film transistors 60 are located in a same layer.

Figure 11:
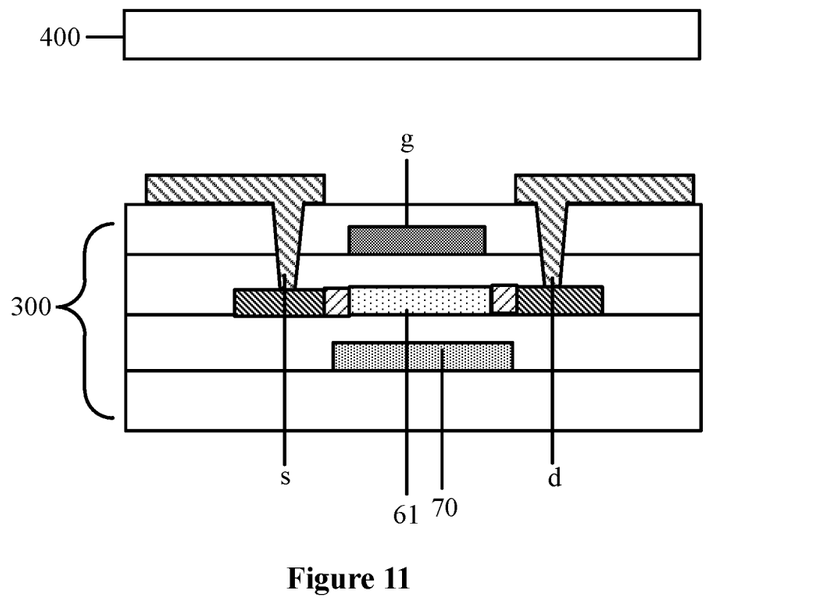
FIG. 11 is a cross-sectional view of a structure of a film transistor in the display panel as shown in FIG. 10.

In one embodiment, as shown in FIG. 11 which is a cross-sectional view of a structure of a film transistor in the display panel as shown in FIG. 10, the gate electrode g of the film transistor 60 is located on a side of the source electrode s and drain electrode d of the film transistor 60 facing towards the color film substrate 400. In the embodiment, a light shielding layer 70 is arranged on a side of the source electrodes and the drain electrode d facing away from the gate electrode g. A projection of the light shielding layer 70 covers a projection of a channel region 61 of the film transistor 60 in the direction perpendicular to the surface of the display panel, so that the light shielding layer 70 can shield the channel region 61 of the film transistor 60 from a light, to avoid affection on the electricity of the film transistor 60 caused by a light illuminating the channel region 61 of the film transistor 60.

Figure 12:
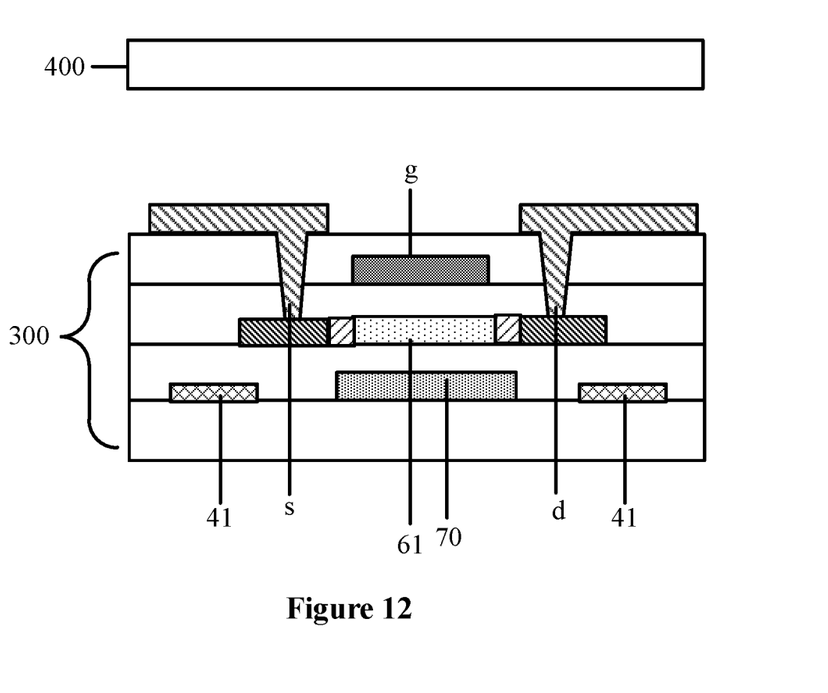
FIG. 12 is a cross-sectional view of a display panel according to the present disclosure.

In one embodiment, as shown in FIG. 12 which is a cross-sectional view of a display panel according to the embodiment, the sensing coils 41 of the sensing antenna 40 are located in a same layer as the light shielding layer 70, in order to simply the structure of the display panel and reduce the thickness of the display panel, which is advantageous for developing a light and thin display panel.

It should be noted that, in the case that the sensing coils 41 are located in a same layer as the light shielding layer 70, the sensing coils 41 and the light shielding layer 70 are optionally made of a same material and formed in a same process, in order to simplify the producing process of the display panel and improve the producing efficiency of the display panel.

Figure 13:
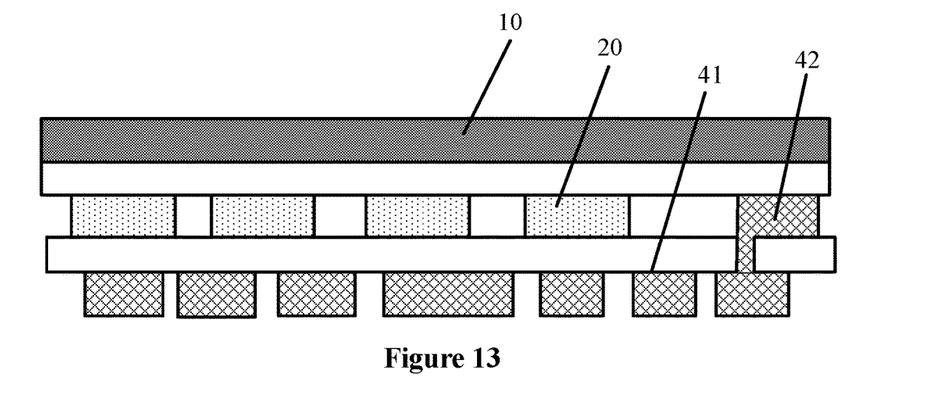
FIG. 13 is a cross-sectional view of a display panel according to the present disclosure.
Figure 14:
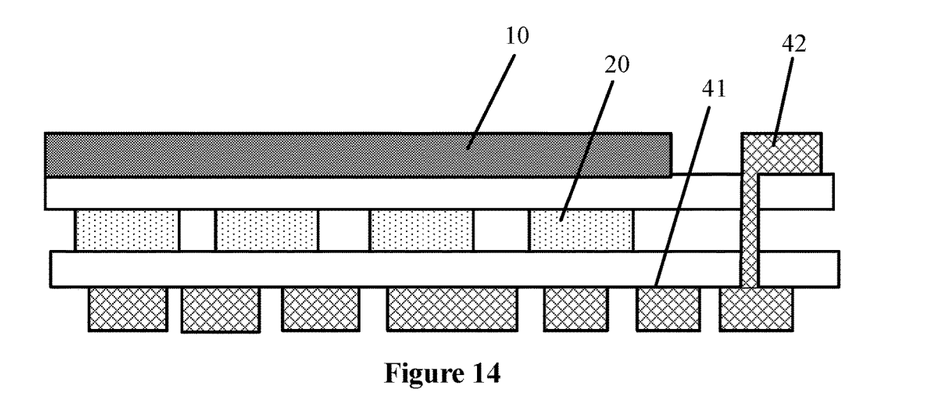
FIG. 14 is a cross-sectional view of a display panel according to the present disclosure.

In an embodiment on the basis of any one of the above embodiments, as shown in FIG. 13 which is a cross-sectional view of a display panel according to the embodiment, a first lead 42 of the sensing antenna 40 is in a same layer as the scan lines 20. In an embodiment on the basis of any one of the above embodiments, as shown in FIG. 14 which is a cross-sectional view of a display panel according to the embodiment, a first lead 42 of the sensing antenna 40 is in a same layer as the data lines 10. In these ways, the structure of the display panel is simplified, and the thickness of the display panel is reduced, which is advantageous for developing a light and thin display panel. However, the relative positions between the first lead 42 of the sensing antenna 40 and the data lines 10 are not limited in the present disclosure, and can be determined with practical requirements.

Figure 15:
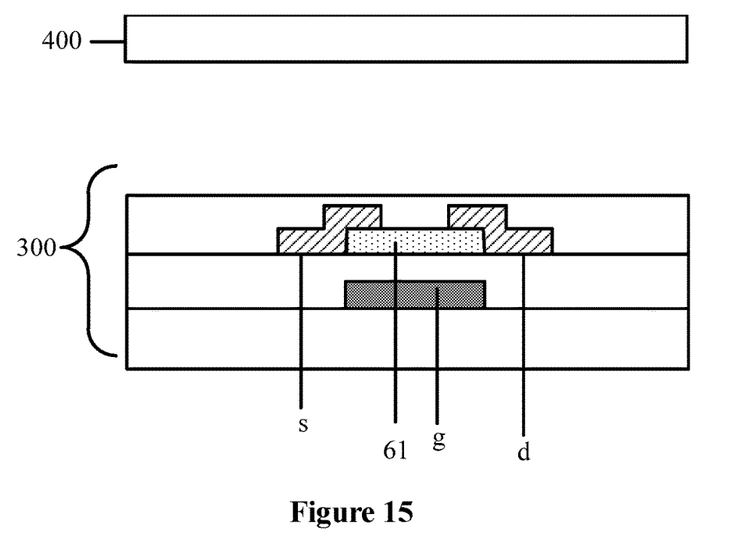
FIG. 15 is a cross-sectional view of another structure of a film transistor in the display panel as shown in FIG. 10.

In another embodiment, the film transistor is in a bottom-gate structure, as shown in FIG. 15 which is a cross-sectional view of another structure of a film transistor in the display panel as shown in FIG. 10. The gate electrode g of the film transistor 60 is located on a side of the source electrode s and the drain electrode d of the film transistor 60 facing away from the color film substrate 400. In the embodiment, the sensing coils 41 are in a different layer from and insulated from the gate electrodes g and the source electrodes s/drain electrodes d of the film transistors 60. Optionally, in the embodiment, the film transistors 60 include low-temperature polysilicon film transistors, which however is not limited in the present disclosure, and can be determined with practical requirements.

It should be noted that, in this embodiment, the sensing coils 41 in the sensing antenna 40 may be arranged in a separate layer, or in a same layer as other elements, which is not limited in the present disclosure, as long as the sensing antenna 40 is ensured to be at least partly located in the display region 100 of the display panel, and have no affection on the normal display of the display panel.

Figure 16:
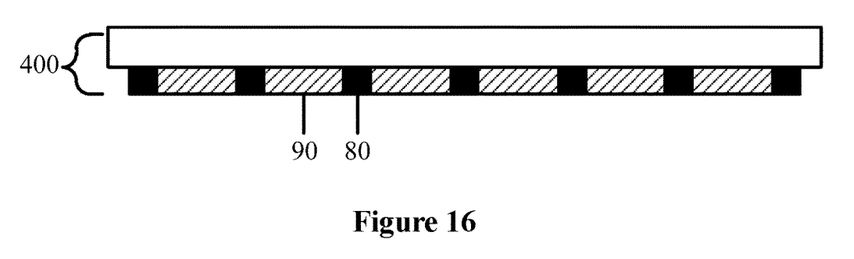
FIG. 16 is a cross-sectional view of a color film substrate in a display panel according to the present disclosure.

As shown in FIG. 16, which is a cross-sectional view of a color film substrate in a display panel according to the present disclosure, the color film substrate 400 includes a black matrix 80 and a color resistor 90 defined by the black matrix 80. A projection of the black matrix 80 covers the projections of the data lines 10 and the scan lines 20 in the array substrate 300 in the direction perpendicular to the surface of the display panel. The way that the projection of the black matrix 80 covers the projections of the data lines 10 and the scan lines 20 in the array substrate 300 in the direction perpendicular to the surface of the display panel includes a way that the projection of the black matrix 80 superposes exactly the projections of the data lines 10 and the scan lines 20 in the array substrate 300 in the direction perpendicular to the surface of the display panel, and may include a way that the projection of the black matrix 80 is larger than the projections of the data lines 10 and the scan lines 20 in the array substrate 300 in the direction perpendicular to the surface of the display panel, which is not limited in the present disclosure, as long as the projections of the data lines 10 and the scan lines 20 in the array substrate 300 are within the projection of the black matrix 80 in the direction perpendicular to the surface of the display panel.

Figure 17:
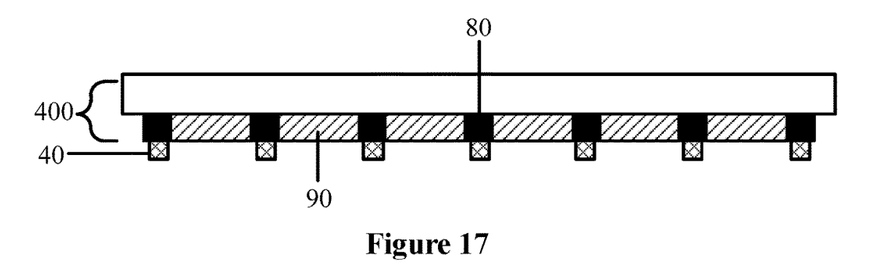
FIG. 17 is a schematic diagram of relative position relation between a color film substrate and a sensing antenna in a display panel according to the present disclosure.

In an embodiment on the basis of the above embodiment, the sensing antenna 40 may be integrated in the array substrate 300 or the color film substrate 400. In a case that the sensing antenna 40 is integrated in the color film substrate 400, the sensing antenna 40 is optionally located on a side of the black matrix 80 facing towards the array substrate 300, as shown in FIG. 17 which is a schematic diagram of relative position relation between a color film substrate and a sensing antenna in a display panel according to the embodiment, which however is not limited in the present disclosure and can be determined with practical requirements.

In an embodiment on the basis of any one of the above embodiments, an electrical resistivity of the sensing antenna 40 is in a range of $1.5\times10^{-8}$ Ω·m to $5.8\times10^{-8}$ Ω·m, inclusive, in order to reduce the resistance loss of the sensing antenna 40. Optionally, the sensing antenna 40 is made of aluminum or molybdenum, which however is not limited in the present disclosure and can be determined with practical requirements.

Figure 18:
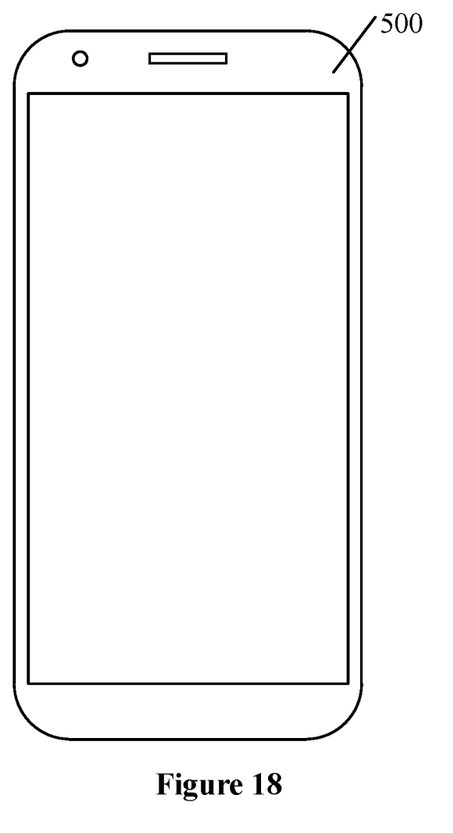
FIG. 18 is a schematic structural diagram of a display device according to the present disclosure.

In addition, a display device is further provided according to the present disclosure. As shown in FIG. 18, which is a schematic structural diagram of a display device according to the embodiment, the display device 500 in the embodiment includes the display panel according to any one of the above embodiments.

In summary, the display panel and the display device including the display panel provided according to the embodiments in the present disclosure include the data lines 10 and the scan lines 20 arranged to be intersected, and the sensing antenna 40. The data lines 10 and the scan lines 20 arranged to be intersected are located in the display region 100 of the display panel, and define the multiple sub-pixels 30. The sensing antenna 40 includes the multiple sensing coils 41 and is at least partly located in the display region 100 of the display panel, in order to enlarge the area occupied by the sensing antenna 40 and increase the number of the sensing coils 41 that can be accommodated in the display panel, thereby improving the conversion efficiency of the sensing antenna 40. Also, in the display panel provided according to the embodiments in the present disclosure, the projections of the data lines 10 and/or the scan lines 20 cover the projections of the sensing coils 41 in the direction perpendicular to the surface of the display panel, in order to avoid affection on the aperture ratio of the display panel caused by the sensing coils 41 located in the display region 100.

Various parts of the specification are described in a progressive way, and each part lays emphasis on differences from other parts. For the same or similar parts between various parts, one may refer to the description of other parts.

It should be noted that, the relationship terminologies such as first and second and the like are only used herein to distinguish an entity or operation from another entity or operation, and it is not necessarily required or implied that there are any actual relationship or order of this kind between those entities and operations. Moreover, the terminologies of "comprise", "include", and any other variants are intended to cover the non-exclusive contains so that the processes, methods, articles or equipment including a series of elements not only include those elements but also include other elements that are not listed definitely or also include the elements inherent in the processes, methods, articles or equipment. In the case of no more restrictions, the elements defined by the statement "include one . . . " do not exclude that other same elements also exist in the processes, methods, articles or equipment including the elements.

The description of the embodiments herein enables those skilled in the art to implement or use the disclosure. Numerous modifications to the embodiments are apparent to those skilled in the art, and the general principle herein can be implemented in other embodiments without deviation from the spirit or scope of the present disclosure. Therefore, the present disclosure is not limited to the embodiments described herein, but in accordance with the widest scope consistent with the principle and novel features disclosed herein.

The invention claimed is:

1. A display panel, comprising:
   data lines and scan lines arranged to be intersected and located in a display region of the display panel, wherein the data lines and the scan lines define a plurality of sub-pixels; and
   a sensing antenna comprising a plurality of sensing coils and at least partly located in the display region of the display panel, wherein projections of the data lines and/or the scan lines cover projections of the sensing coils in a direction perpendicular to a surface of the display panel;
   wherein an electrical resistivity of the sensing antenna is in a range of $1.5\times10^{-8}$ Ω·m to $5.8\times10^{-8}$ Ω·m, inclusive.

2. The display panel according to claim 1, wherein the sensing antenna comprises a first lead at one end of the sensing antenna and a second lead at the other end of the sensing antenna, the first lead is in a different layer from the sensing coils and is overlapped with the sensing coils, and the second lead is in a same layer as the sensing coils and is not overlapped with the sensing coils.

3. The display panel according to claim 2, wherein the first lead and the second lead are electrically connected to a drive circuit, and the drive circuit is configured to provide a driving signal to the sensing antenna and detect a current signal in the sensing antenna.

4. The display panel according to claim 2, wherein one part of the sensing antenna is located in the display region of the display panel and the other part of the sensing antenna is located in a border region of the display panel, and a part of the leads at either end of the sensing antenna overlapped with the sensing coils is located in the border region of the display panel.

5. The display panel according to claim 1, further comprising an array substrate and a color film substrate arranged opposite to each other, wherein
   the data lines and the scan lines are located in the array substrate, and the sensing antenna is integrated in the array substrate or the color film substrate.

6. The display panel according to claim 5, wherein the array substrate further comprises film transistors electrically connected to the data lines and the scan lines; and gate electrodes of the film transistors are electrically connected to the scan lines, and source electrodes or drain electrodes of the film transistors are electrically connected to the data lines, and the film transistors are configured to control display of the sub-pixels.

7. The display panel according to claim 6, wherein for each of the film transistors, the film transistor is in a top-gate structure, a light shielding layer is arranged on a side of the source electrode and the drain electrode of the film transistor facing away from the gate electrode of the film transistor, and a projection of the light shielding layer covers a projection of a channel region of the film transistor in the direction perpendicular to the surface of the display panel.

8. The display panel according to claim 7, wherein the sensing coils of the sensing antenna are located in a same layer as the light shielding layer.

9. The display panel according to claim 8, wherein the sensing coils and the light shielding layer are made of a same material and formed in a same process.

10. The display panel according to claim 8, wherein a first lead of the sensing antenna is in a same layer as the scan lines; or a first lead of the sensing antenna is in a same layer as the data lines.

11. The display panel according to claim 6, wherein for each of the film transistors, the film transistor is in a bottom-gate structure, and the sensing coils are in a different layer from and insulated from the gate electrode and the source electrode/drain electrode of the film transistor.

12. The display panel according to claim 6, wherein the film transistors include low-temperature polysilicon film transistors.

13. The display panel according to claim 5, wherein the color film substrate comprises a black matrix and a color resistor defined by the black matrix, a projection of the black matrix covers the projections of the data lines and the scan lines in the array substrate in the direction perpendicular to the surface of the display panel.

14. The display panel according to claim 13, wherein the sensing antenna is located on a side of the black matrix facing towards the array substrate.

15. The display panel according to claim 13, wherein the sensing antenna is made of aluminum or molybdenum.

16. A display device comprising a display panel, wherein the display panel comprises:

data lines and scan lines arranged to be intersected and located in a display region of the display panel, wherein the data lines and the scan lines define a plurality of sub-pixels; and a sensing antenna comprising a plurality of sensing coils and at least partly located in the display region of the display panel, wherein projections of the data lines and/or the scan lines cover projections of the sensing coils in a direction perpendicular to a surface of the display panel;

wherein an electrical resistivity of the sensing antenna is in a range of $1.5 \times 10^{-8}$ Ω·m to $5.8 \times 10^{-8}$ Ω·m, inclusive.

17. The display device according to claim 16, wherein the sensing antenna comprises a first lead at one end of the sensing antenna and a second lead at the other end of the sensing antenna, the first lead is in a different layer from the sensing coils and is overlapped with the sensing coils, and the second lead is in a same layer as the sensing coils and is not overlapped with the sensing coils.

18. The display device according to claim 17, wherein the first lead and the second lead are electrically connected to a drive circuit, and the drive circuit is configured to provide a driving signal to the sensing antenna and detect a current signal in the sensing antenna.

19. The display device according to claim 17, wherein one part of the sensing antenna is located in the display region of the display panel and the other part of the sensing antenna is located in a border region of the display panel, and a part of the leads at either end of the sensing antenna overlapped with the sensing coils is located in the border region of the display panel.

* * * * *